US006211713B1

United States Patent
Uhlmann

(10) Patent No.: US 6,211,713 B1
(45) Date of Patent: Apr. 3, 2001

(54) ADJUSTABLE FEEDBACK FOR CMOS LATCHES

(75) Inventor: Gregory John Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/305,774

(22) Filed: Apr. 27, 1999

(51) Int. Cl.[7] ................................................. H03K 3/356
(52) U.S. Cl. ............................ 327/211; 327/201; 327/215
(58) Field of Search ..................................... 327/199–203, 327/208, 210–213, 214, 218, 219, 220–222, 225

(56) References Cited

U.S. PATENT DOCUMENTS

| | | | |
|---|---|---|---|
| 5,467,038 | * 11/1995 | Motley et al. | 327/208 |
| 5,767,716 | * 6/1998 | Ko | 327/203 |
| 5,769,283 | * 8/1998 | Martin | 327/218 |
| 5,825,225 | * 10/1998 | Sugisawa et al. | 327/108 |

OTHER PUBLICATIONS

"Method and Apparatus to Control Noise In a Dynamic Circuit," Serial No. 09/041,982; filed Mar. 13, 1998, pp. 1–29.

* cited by examiner

*Primary Examiner*—Terry D. Cunningham
*Assistant Examiner*—Long Nguyen
(74) *Attorney, Agent, or Firm*—Felsman, Bradley, Vaden, Gunter & Dillon, LLP

(57) ABSTRACT

An improved latch circuit having a dynamically adjustable internal feedback level. The improved latch circuit includes a latch inverter and a feedback inverter cross-coupled with the latch inverter. A controllable supplemental feedback inverter is connected in parallel with the feedback inverter to provide a controllable level of feedback to the latch inverter. An independently selectable control signal enables or disables the controllable feedback inverter in conformity with a need for more or less feedback, such that the internal feedback level may provide optimal functionality and performance of the latch circuit.

8 Claims, 4 Drawing Sheets

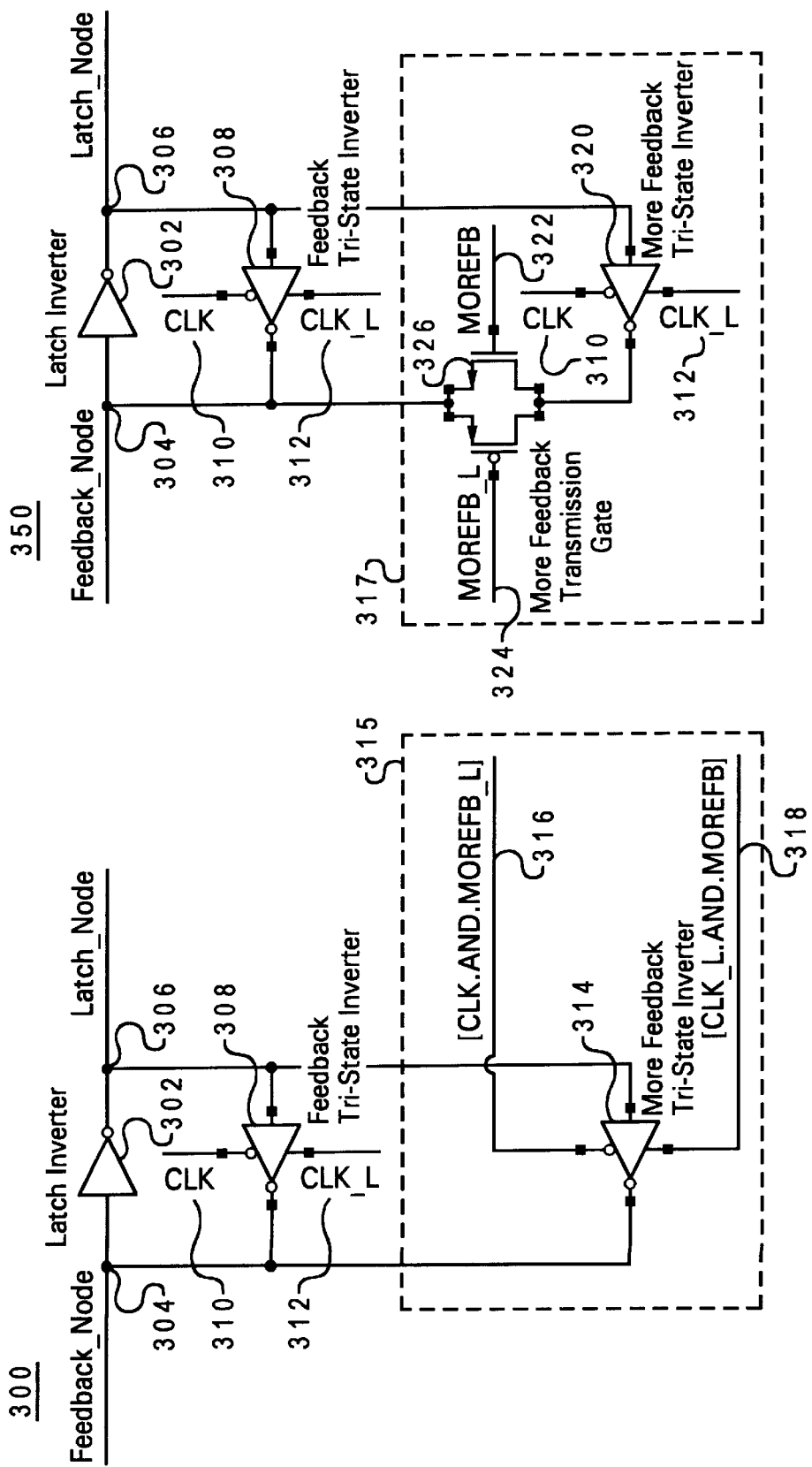

ADJUSTABLE FEEDBACK FOR CMOS LATCHES

TECHNICAL FIELD

The present invention relates in general to digital latches, and in particular to a method and system for altering the amount of feedback within a latch in conformity with actual operating requirements. Still more particularly, the present invention relates to a method and system which varies feedback within CMOS latch circuits to provide an optimal balance between functionality and performance of the circuit.

DESCRIPTION OF THE RELATED ART

Digital logic systems may be generally categorized as either combinatorial or sequential. A combinatorial circuit consists of logic gates whose outputs at any time are determined directly from the values of the present inputs. A combinational circuit performs a specific information processing operation which can be specified logically by a set of Boolean expressions. Sequential circuits employ storage elements called flip-flops in addition to the logic gates. Their outputs are a function of the inputs and the state of the storage elements. The state of the storage elements, in turn, is a function of previous inputs. As a consequence, the outputs of a sequential circuit depend not only on the present values of the inputs, but also on past inputs, and the circuit behavior must be specified by a time sequence of inputs and internal states.

While every digital system is likely to have a combinational circuit, most systems encountered in practice include storage elements such as latches. Examples of digital circuits employing latches include registers, counters, static memory arrays, etc.

Referring to FIGS. 1A and 1B, a conventional CMOS latch circuit 100 and its accompanying timing diagram 115 are depicted. A storage node 102 within latch circuit 100 is comprised of a latch inverter 104 and a feedback inverter 106. Latch circuit 100 is configured in a cross-coupled configuration in which the output of latch inverter 104 is coupled to the input of feedback inverter 106 at latch node 114. A feedback node 112 is the common point where the output of feedback inverter 106 is coupled to the input of latch inverter 104. Data stored at any given point in time at feedback node 112 is buffered from input data by clocked input inverter 108 and from the output of latch circuit 100 by output inverter 110. Timing diagram 115 of FIG. 1B illustrates the operation of latch circuit 100 with respect to the relative signal levels existing within the circuit.

CMOS latches, such as CMOS latch 100, are utilized to store digital data in the form of a logical "1" or a logical "0". When clock input 116 is asserted, latch circuit 100 becomes either "transparent" or "opaque". "Transparent" means that the latch is open and a data bit can pass from input 118 to feedback node 112. "Opaque" means that latch circuit 100 is closed and output 120 holds the last data that passed through while the latch was transparent.

The central components of storage node 102 are a pair of cross-coupled inverters 104 and 106. Latch inverter 104 has its output port connected to latch node 114 and is referred to as the "latch inverter". Inverter 106 has its output connected to feedback node 112 and is known as the "feedback inverter". This cross-coupled pair of inverters is incorporated in latch circuit 100 at feedback node 112 as portrayed in FIG. 1. An output node 120 of CMOS latch 100 is the buffered output of output inverter 110. Clocked inverter 108 has an input/output clock control means. Clocked inverter 108 is a tri-state inverter with its control inputs coupled to a system clock 116 (not depicted), and the inverse of the system clock 122.

Conventionally, a feedback inverter such as feedback inverter 106 is designed to provide enough feedback to store a data input accurately in an electrically noisy environment. The amount of feedback provided by feedback inverter 106 must not, however, be so great that new data is blocked from access into CMOS latch 100. Thus, there is always an engineering tradeoff between functionality and performance.

Variable environmental and operational conditions often dictate that a designer design for the worst-case situation. To ensure adequate long-term reliability, circuits are subjected to extremely high voltages and temperatures during manufacturing tests such as burn-in testing or Dynamic Voltage Stress (DVS). The extreme conditions experienced by the tested circuitry are designed to accelerate early failures by subjecting the circuitry to conditions which are rarely ever encountered when the circuit is actually operated. These conditions aggravate leakage and noise, thus requiring the designer to implement a greater amount of feedback to permit the circuit to function during testing. Performance is of secondary importance to functionality during these manufacturing testing regimens. In normal operation, however, performance, particularly with respect to circuit speed, is also of paramount importance. Since the circuitry has been designed with an amount of feedback necessary to counteract the unrealistic environments utilized during testing, performance and speed are degraded by excessive feedback during normal circuit operations.

Modern circuits have much higher operating speeds and lower operating voltages than previous generations of integrated circuits. A current standard for state-of-the-art integrated circuits is 1.8 volts. Thus the effect of feedback on the performance a CMOS latch, in terms of switching speed, is increasingly pronounced.

It would therefore be desirable to provide a controllable feedback source for a CMOS latch. Further, it would be desirable to be able to control the amount of feedback in a CMOS latch such that functionality during testing is preserved, and performance during normal operation is optimized.

SUMMARY OF THE INVENTION

It is an object of the present invention to provide improved digital latches.

It is another object of the present invention to provide a method and system for altering the amount of feedback within a latch in conformity with actual operating requirements.

It is still another object of the present invention to provide a method and system which varies feedback within CMOS latch circuits to provide an optimal balance between functionality and performance of the circuit.

The foregoing objects are achieved as is now described. An improved latch circuit having a dynamically adjustable internal feedback level is disclosed. The improved latch circuit includes a latch inverter and a feedback inverter cross-coupled with the latch inverter. A controllable supplemental feedback inverter is connected in parallel with the feedback inverter to provide a controllable level of feedback to the latch inverter. An independently selectable control signal enables or disables the controllable feedback inverter in conformity with a need for more or less feedback, such that the internal feedback level may provide optimal functionality and performance of the latch circuit.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1A is a timing diagram illustrating the operation of the conventional CMOS latch circuit of FIG. 1A;

FIG. 3A illustrates an improved tri-state inverter feedback system within a CMOS latch;

FIG. 3B depicts an alternate embodiment of the tri-state inverter feedback system depicted in FIG. 3A;

DETAILED DESCRIPTION OF ILLUSTRATIVE EMBODIMENT

The system and method of the present invention provides integrated circuit designers control over the utilization of additional feedback for latches. Designers have conventionally had to design for the worst case circumstances which sacrifices performance in order to provide sufficient functionality during testing. The present invention allows designers to account for the variation in operating conditions that a CMOS latch may experience and adjust the feedback in the latch accordingly. Designers are thus provided the option to design for both performance in normal operating mode, and for functionality in high stress conditions such as burn-in and DVS testing.

Figure 1A:
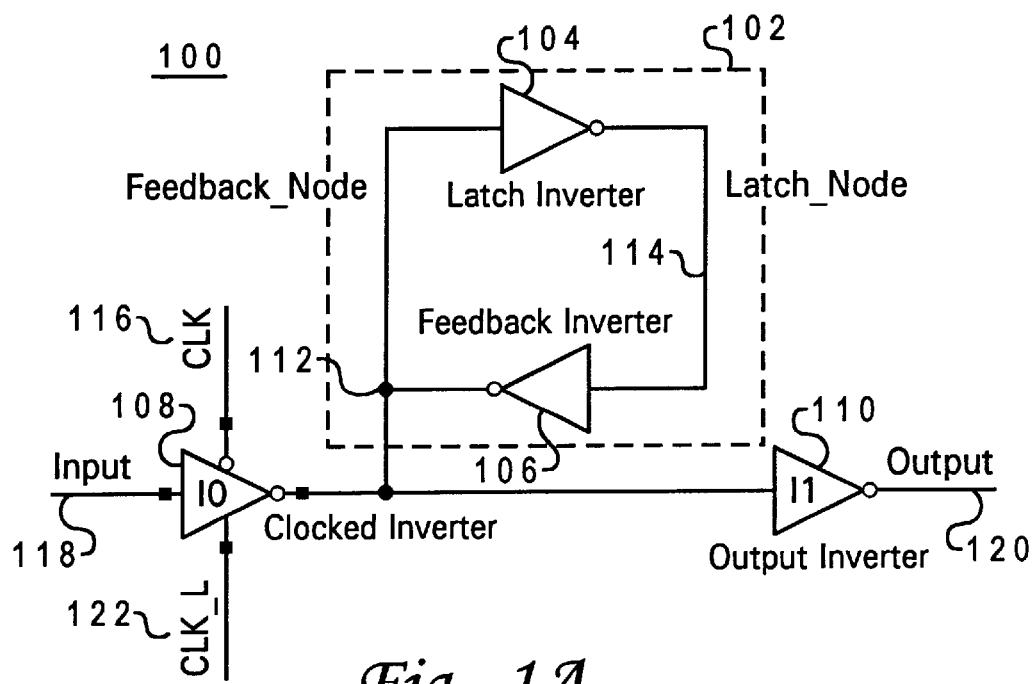
FIG. 1A depicts a schematic representation of a conventional cross-coupled CMOS latch circuit configuration.
Figure 1B:
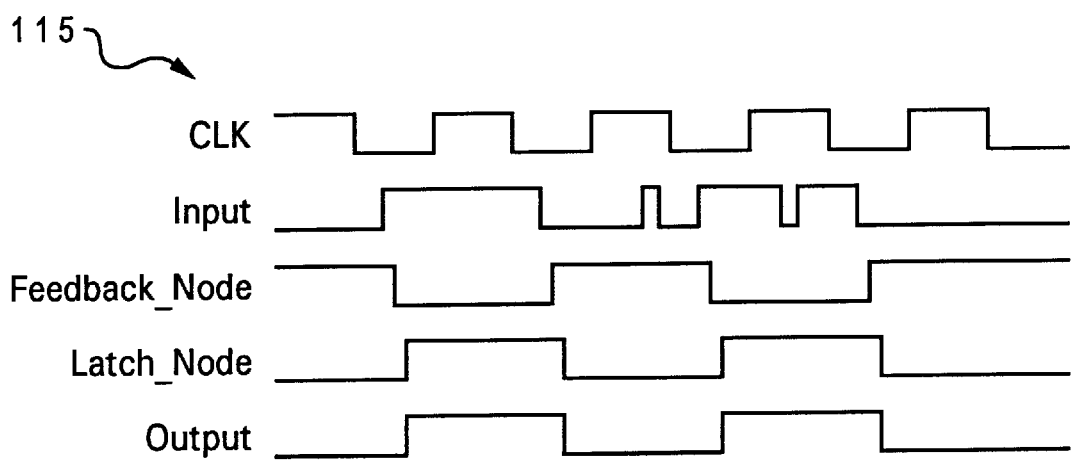
Figures 2A, 2B:
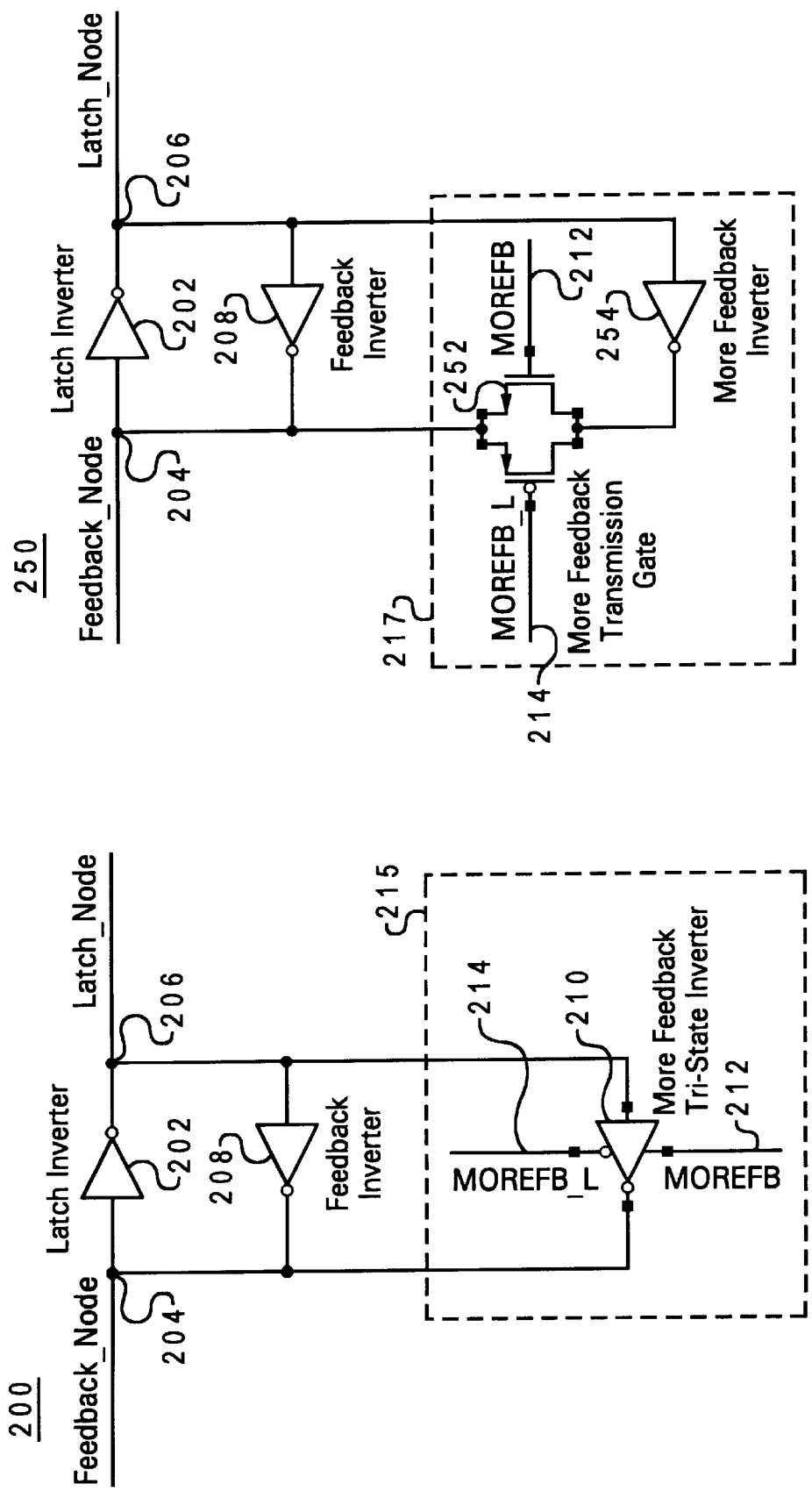
FIG. 2A illustrates an improved feedback system for a CMOS latch in accordance with the teachings of the present invention.
FIG. 2B depicts an alternate embodiment of the feedback system depicted in FIG. 2A.

Turning now to the figures, and in particular to FIGS. 2A and 2B, there are depicted alternate embodiments of the improved latch circuit of the present invention. As illustrated in FIG. 2A, a Complementary Metal Oxide Semiconductor (CMOS) latch circuit 200 includes a latch inverter 202 and a feedback inverter 208. Although not explicitly shown, each of the inverters depicted within latch circuit 200 are constructed in accordance with typical CMOS convention, meaning that each inverter includes complementary pairs of P-type Field Effect Transistors (PFETs) and N-type Field Effect Transistors (NFETs).

In addition to the above-described circuit elements, latch circuit 200 includes a controllable feedback circuit 215 that is connected in parallel with feedback inverter 208. As depicted in FIG. 2A, controllable feedback circuit 215 is comprised of a tri-state inverter 210 which receives a feedback enable control signal 212 and a complementary feedback enable signal 214. In the embodiment depicted, when feedback enable signal 212 is asserted high (set to a logic "1"), additional feedback will be provided to feedback node 204 from latch node 206 via tri-state inverter 210. Conversely, when feedback enable signal is low (set to a logic "0"), the additional feedback provided by tri-state inverter 210 will be disabled. In this "feedback disable" mode, latch circuit 200 will be provided a lesser and constant level of feedback via feedback inverter 208.

FIG. 2B illustrates an alternate embodiment of the present invention for implementing the feedback system depicted in FIG. 2A. It should be noted that in FIGS. 2A and 2B, like parts are identified by the same number. Latch circuit 250 also includes latch inverter 202 cross-coupled with feedback inverter 208 at feedback node 204 and latch node 206. In addition, latch circuit 250 includes a controllable feedback circuit 217 that is comprised of an inverter 254 and a transmission gate 252. Transmission gate 252 serves as a controlled pass-gate, and receives feedback enable signal 212 and an inverse feedback enable signal 214 as its control inputs. When feedback enable signal 212 is asserted high, transmission gate 252 "opens" and permits feedback node 204 to receive additional feedback from latch node 206 via feedback inverter 254. Although in the embodiment depicted, transmission gate 252 is constructed of an N-type field-effect transistor (NFET) coupled in parallel with a P-type FET (PFET), it will be appreciated and understood by those skilled in the art that other electronic devices may be combined in a variety of ways to achieve the same switching effect as transmission gate 252 without departing from the spirit or scope of the present invention.

Figure 4:
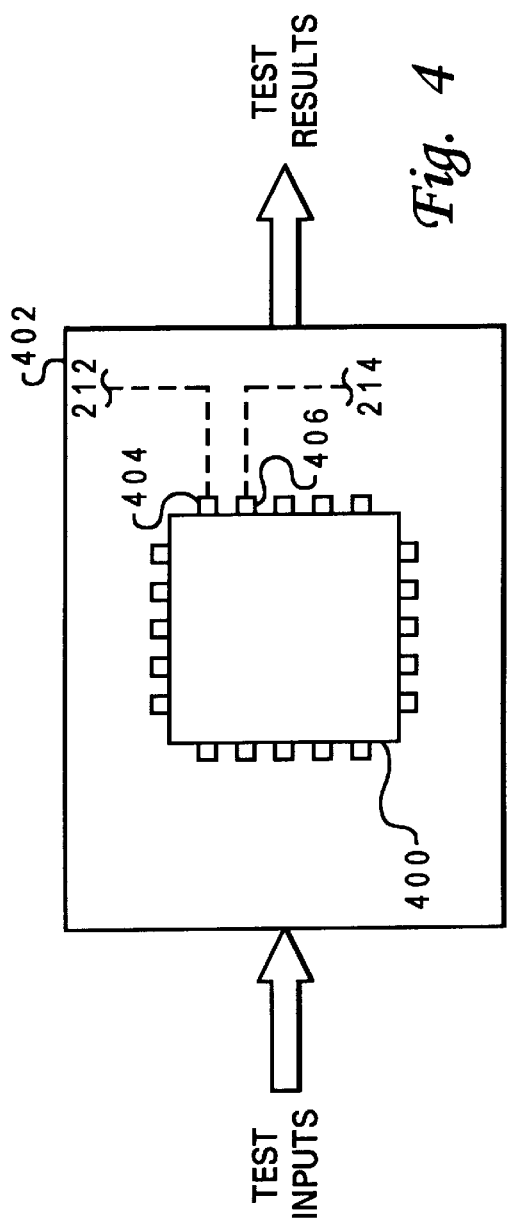
FIG. 4 illustrates testing an integrated circuit chip that includes a CMOS latch having a controllable feedback circuit.

Feedback enable signal 212 and its complement, inverse feedback enable signal 214, provide an independently selectable means for controlling feedback into feedback node 204 within latches 200 and 250. For example, latch 200 or latch 250 may be included in an integrated circuit (IC) chip. That is, latch 200 may be fabricated on a monolithic semiconductor substrate utilizing suitable conventional microelectronic chip fabication techniques and materials. As illustrated in FIG. 4, such a chip 400 may be placed in a chip tester 402 and subjected to a conventional reliability stress test in which voltages and temperatures exceed the nominal values expected during normal operation. This may be referred to as a "test mode" of chip 400 and its internal circuits. Chip 400 includes a pair of pins, 404 and 406, that are coupled to feedback enable signals 212 and 214 respectively.

As an example, a scannable test latch (not shown) could centrally generate feedback enable signals 212 and 214, which could be distributed via suitable buffers to multiple latch circuits having improved latch feedback circuits as described herein. Alternatively, local copies of the signal generated by the scannable test latch could be generated, allowing local or individual control over different groups of latch circuits. Other alternative means for generating or coupling feedback enable signals 212 and 214 may be suitable. In any event, the signals utilized to control the amount of feedback, which in the embodiments depicted herein are named "feedback enable signals", refer to signals generated externally to, and therefore independent of, the latch circuits into which they are coupled. The operator of chip tester 402 may assert feedback enable signals 212 and 214 during the reliability stress test by applying $V_{dd}$ to pin 404 and ground to pin 406. If chip 400 fails the test, it is likely that the failure was due to a cause other than leakage or noise affecting latch circuit 200 because this method of testing should adequately fortify latch circuit 200 against the detrimental effects of leakage and noise during testing.

Figure 5:
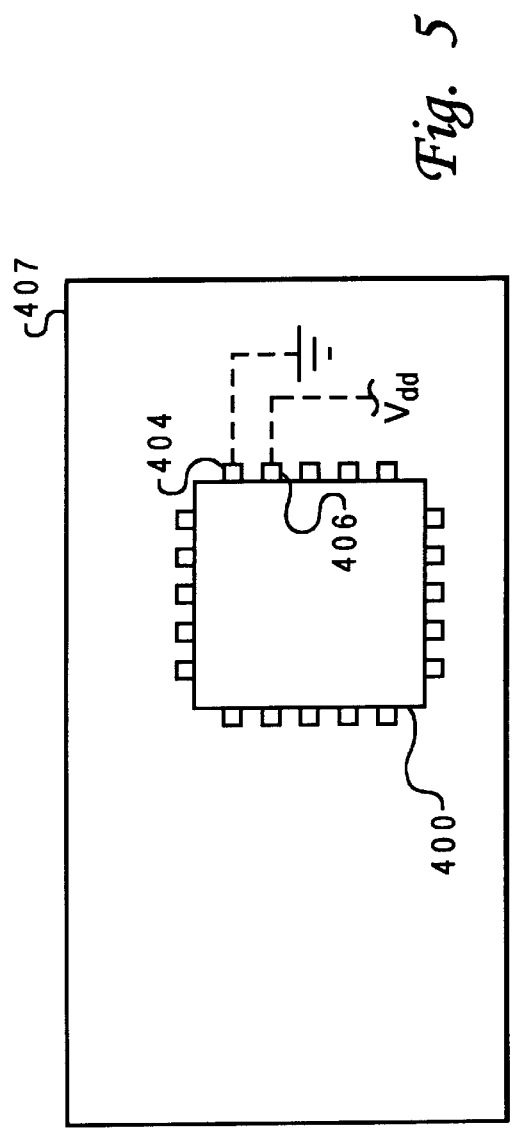
FIG. 5 depicts normal operation in an electronic device of an integrated circuit chip that includes a CMOS latch having a controllable feedback circuit.

As depicted in FIG. 5, chip 400 may be installed in an electronic digital device 407, such as a computer. Pin 404 is connected to ground, but chip 400 is otherwise installed in the conventional manner. Latch circuit 200 therefore operates with minimal delay because feedback inverter 208 preferably provides only the minimum feedback necessary to counteract the detrimental effects of leakage, noise mechanisms, and similar factors under normal operating conditions. A skilled designer may select the relative sizes of latch inverter 202, feedback inverter 208, and supplementary feedback inverters 210 or 254 to select the amount of feedback provided when feedback enable signals 212 and 214 are asserted relative to the amount of feedback provided when these signals are at ground. An end-user may utilize the computer or other electronic device in the normal or conventional manner, which may be referred to as the "normal operation mode" of chip 400 and its circuits.

Although the above-described example of utilizing the latch in a test mode versus utilizing it in a normal operating mode illustrates one circumstance under which one may utilize the feedback enable signals to selectively control feedback and the corresponding sensitivity of the latch to leakage and noise mechanisms, more generally, the enable signals may be utilized to increase either performance or functional robustness of a CMOS latch under any circumstance. Also, although in the illustrated embodiments the enable signals and corresponding feedback have two states, an alternate embodiment of the present invention may include an analog feedback enable signal that is continuously controllable.

As an example, feedback enable signal 212 and its complement 214 may be stored in a scannable latch from which it may be distributed to latch 200 or latch 250 during IC chip testing.

With reference now to FIGS. 3A and 3B, there are depicted alternate embodiments of the present invention in which a system clock is included in the controllable feedback circuit of each. Like parts will be identified by the same number in FIGS. 3A and 3B. As illustrated in FIG. 3A, a latch 300 includes a feedback inverter 308 that, in the embodiment depicted, is a tri-state inverter. Tri-state feedback inverter 308 has a system clock 310 and its complement 312, applied as its control inputs. When system clock 310 is asserted high, feedback inverter 308 is enabled to provide feedback from latch node 306 to feedback node 304. Conversely, when system clock 310 is low, feedback inverter 308 is disabled.

As illustrated in FIG. 3A, latch 300 also includes a controllable feedback circuit 315 that is comprised of a supplementary tri-state feedback inverter 314 having a feedback control signal 316, and an inverse feedback control signal 318, applied to its control inputs. As depicted in FIG. 3A, feedback control signal 316 and its complement 318 are produced by external circuitry which logically 'ANDs' system clock signal 310 and a feedback enable signal, such as feedback enable signal 212. In this manner, additional feedback is provided from latch node 306 to feedback node 304 through supplemental feedback inverter 314 only during periods in which system clock 310 is low and a feedback enable signal is asserted high.

Turning now to FIG. 3B, there is illustrated a latch circuit 350 that is similar to latch 300 except with respect to the composition of controllable feedback circuit 317. As latch 300, latch circuit 350 also includes a feedback tri-state inverter 308 cross-coupled with latch inverter 302. Controllable feedback circuit 317 is comprised of a supplemental feedback tri-state inverter 320 and a transmission gate 326 that together in series are coupled in parallel with feedback inverter 308. Transmission gate 326 serves as a controllable pass-gate, or switch, for additional feedback provided by supplemental feedback inverter 320. An externally generated feedback enable signal 322 and its complement 324 serve as the control inputs to transmission gate 326. Therefore, when the feedback enable signal 322 is asserted high, transmission gate 326 "opens". To implement a similar function to that performed by feedback circuit 315 of FIG. 3A, system clock signal 310 and its complement 312 are utilized as the control inputs for supplemental feedback inverter 320. As seen by the configuration depicted in FIG. 3B, additional feedback is provided to feedback node 304 from supplemental feedback inverter 320 only during periods when both system clock 310 and feedback enable signal 322 are asserted high.

A new class of integrated circuits are currently under development. This new class of integrated circuits is a Silicon On Insulator (SOI) design. SOI technology places the carrier transport layer above an insulating layer on a substrate. An alternate embodiment the present invention implements feedback control to counteract the floating body characteristics of SOI CMOS transistors which makes these transistors particularly susceptible to noise. An alternate embodiment of the controllable feedback circuits depicted in FIGS. 2A, 2B, 3A, and 3B may therefore be advantageously implemented within an SOI technology transistor configuration.

While the invention has been particularly shown and described with reference to a preferred embodiment, it will be understood by those skilled in the art that various changes in form and detail may be made therein without departing from the spirit and scope of the invention.

What is claimed is:

1. A latch circuit having pn adjustable internal feedback level at a feedback node, said latch circuit comprising:
   a feedforward inverter having an input connected to said feedback node;
   a steady state feedback tri-state inverter having an input connected to an output of said feedforward inverter and an output connected to said feedback node, wherein said feedback tri-state inverter receives a clock signal as its control input; and
   a supplementary tri-state inverter cross-coupled with said feedforward inverter such that an output of said tri-state inverter is connected to said feedback node, wherein said supplementary tri-state inverter receives a feedback control signal as its control input for enabling or disabling said supplementary tri-state inverter such that said internal feedback level at said feedback node is adjusted in accordance with both said clock signal and said feedback control signal.

2. The latch circuit of claim 1, wherein said feedforward inverter, said steady state feedback tri-state inverter, and said supplementary tri-state inverter are comprised of a plurality of field-effect transistors.

3. The latch circuit of claim 2, wherein said plurality of field-effect transistors comprise a CMOS transistor configuration.

4. The latch circuit of claim 2, wherein said feedforward inverter is a CMOS inverter having n N-type transistors and n P-type transistors where n is equal to or greater than one.

5. The latch circuit of claim 2, wherein said field-effect transistors are manufactured utilizing silicon on insulator technology.

6. The latch circuit of claim 1, wherein said supplementary tri-state inverter includes at least one control inputfor receiving said feedback control signal.

7. A method for utilizing on integrated circuit chip having a latch circuit, said latch circuit comprising a feedforward inverter having an input connected to a feedback node, wherein said latch circuit further includes a steady state feedback tri-state inverter cross-coupled with said feed forward inverter and a supplemental tri-state inverter connected in parallel with said steady state feedback tri-state inverter, said method comprising the steps of:

applying a clock signal representing a test mode to a control input of said supplemental tri-state inverter; and while applying said clock signal representing a test mode, performing a stress test on said latch circuit.

8. The method of claim 7, further comprising the steps of:

installing said integrated circuit chip in an electronic circuit operational in said normal operating mode; and coupling said control input of said steady state feedback tri-state inverter to a source of said clock signal representing a normal mode.

* * * * *